US008698189B2

(12) United States Patent
Park et al.

(10) Patent No.: US 8,698,189 B2
(45) Date of Patent: Apr. 15, 2014

(54) ORGANIC LIGHT-EMITTING DISPLAY DEVICE AND METHOD OF MANUFACTURING THE SAME

(75) Inventors: Sun Park, Yongin (KR); Jong-Hyun Park, Yongin (KR); Yul-Kyu Lee, Yongin (KR); Kyung-Hoon Park, Yongin (KR); Sang-Ho Moon, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 56 days.

(21) Appl. No.: 13/299,850

(22) Filed: Nov. 18, 2011

(65) Prior Publication Data

US 2013/0001563 A1    Jan. 3, 2013

(30) Foreign Application Priority Data

Jun. 28, 2011    (KR) .................. 10-2011-0063049

(51) Int. Cl.
    *H01L 33/00*    (2010.01)
(52) U.S. Cl.
    USPC .......... 257/99; 257/13; 257/40; 257/85; 257/E51.022; 438/22; 438/82; 438/99; 438/780
(58) Field of Classification Search
    None
    See application file for complete search history.

(56) References Cited

U.S. PATENT DOCUMENTS

| 2006/0086938 A1 | 4/2006 | Kang et al. | |
| 2006/0244155 A1* | 11/2006 | Niizuma | 257/780 |
| 2007/0152222 A1 | 7/2007 | Joo | |
| 2008/0151136 A1* | 6/2008 | Jung et al. | 349/46 |
| 2010/0258859 A1 | 10/2010 | Park | |
| 2012/0139000 A1* | 6/2012 | Lee et al. | 257/99 |

FOREIGN PATENT DOCUMENTS

| KR | 10-0145898 B1 | 5/1998 |
| KR | 10-2000-0010306 A | 2/2000 |
| KR | 10-2004-0060044 A | 7/2004 |
| KR | 10-2005-0081748 A | 8/2005 |
| KR | 10-2006-0037171 | 5/2006 |
| KR | 10-2007-0071083 | 7/2007 |
| KR | 10-2010-0001841 A | 1/2010 |
| KR | 10-2010-0112406 | 10/2010 |

* cited by examiner

*Primary Examiner* — Tan N Tran
*Assistant Examiner* — Scott R Wilson
(74) *Attorney, Agent, or Firm* — Lee & Morse, P.C.

(57) ABSTRACT

An OLED device includes a thin film transistor including an active layer, a gate bottom electrode, a gate top electrode, an insulating layer covering the gate electrode, and a source electrode and a drain electrode on the insulating layer contacting the active layer; an organic light-emitting device electrically connected to the thin film transistor and including a sequentially stacked pixel electrode, on the same layer as the gate bottom electrode, emissive layer, and, opposite electrode, a pad bottom electrode on the same layer as the gate bottom electrode and a pad top electrode pattern on the same layer as the gate top electrode, the pad top electrode pattern including openings exposing the pad bottom electrode, and an insulation pattern covering the upper surface of the pad top electrode pattern on the same layer as the insulating layer, on an upper surface of the pad bottom electrode.

19 Claims, 10 Drawing Sheets

ORGANIC LIGHT-EMITTING DISPLAY DEVICE AND METHOD OF MANUFACTURING THE SAME

CROSS-REFERENCE TO RELATED PATENT APPLICATION

This application claims the benefit of Korean Patent Application No. 10-2011-0063049, filed on Jun. 28, 2011, in the Korean Intellectual Property Office, the disclosure of which is incorporated herein in its entirety by reference.

BACKGROUND

1. Field

Embodiments relate to organic light-emitting display devices and methods of manufacturing the same.

2. Description of the Related Art

Flat panel display devices, such as organic light-emitting display devices or liquid crystal display devices, are manufactured on a substrate on which a pattern including a thin film transistor (TFT), a capacitor, and wirings for connecting these elements is formed.

SUMMARY

According to an embodiment, there is provided an organic light-emitting display device including a thin film transistor including an active layer, a gate electrode including a gate bottom electrode and a gate top electrode, an insulating layer, and a source electrode and a drain electrode formed on the insulating layer to contact the active layer, an organic light-emitting device that is electrically connected to the thin film transistor and includes a pixel electrode formed of a same layer as the gate bottom electrode, an intermediate layer including an emissive layer, and an opposite electrode, the pixel electrode, intermediate layer and opposite electrode being sequentially stacked, and a pad electrode including a pad bottom electrode formed of the same layer as the gate bottom electrode and a pad top electrode formed of a same layer as the gate top electrode, wherein the pad top electrode includes openings that expose the pad bottom electrode, and an electrode pattern formed of a same layer as the pad top electrode and an insulation pattern that covers an upper surface of the electrode pattern and is formed of a same layer as the insulating layer, wherein the electrode pattern and the insulation pattern are formed on an upper surface of the pad bottom electrode that is exposed to the outside through the openings.

The pad bottom electrode and side portions of the electrode pattern that are exposed to the outside through the openings may configured to be electrically connected to a driver IC that supplies a current to drive the organic light-emitting display device.

The pad bottom electrode and the side portions of the electrode pattern that are exposed to the outside through the openings may be configured to be electrically connected to the driver IC via conductive balls.

The electrode pattern may be connected to the pad top electrode.

The electrode pattern may protrude from the pad top electrode to at least a center portion of the pad bottom electrode that is exposed to the outside through the openings.

The electrode pattern may include a through-hole that exposes the pad bottom electrode below.

The pad bottom electrode and the side portions of the electrode pattern may be configured to be electrically connected to the driver IC via conductive balls disposed in the through-hole, and a maximum width of the through-hole is greater than a maximum width of the conductive balls.

The electrode pattern may include at least one bar that is connected to the pad top electrode.

The electrode pattern and the insulation pattern may have a same pattern.

The pad electrode may be electrically connected to the thin film transistor or the organic light-emitting display device via wirings.

The pad bottom electrode may include a material that has a better corrosion resistance than the pad top electrode and the electrode pattern.

The gate bottom electrode, the pixel electrode, and the pad bottom electrode may include a transparent conductive metal oxide. The gate top electrode, the pad top electrode, and the electrode pattern may include at least one of Ag, Mg, Al, Pt, Pd, Au, Ni, Nd, Ir, Cr, Li, Ca, Mo, Ti, W, MoW, and Cu.

The organic light-emitting display device may further include a capacitor that includes a capacitor bottom electrode formed of a same layer as the active layer and a capacitor top electrode formed of same layers as the gate electrode and that is electrically connected to the thin film transistor.

According to an embodiment, there is provided a method of manufacturing an organic light-emitting display device, the method including a first mask operation in which an active layer of a thin film transistor is formed on a substrate, a second mask operation in which a first electrode unit for forming a pixel electrode, a gate electrode, and a second electrode unit for forming a pad electrode are formed on the substrate, a third mask operation in which an interlayer insulating layer is formed, the interlayer insulating layer having contact holes that expose two side upper portions of the active layer, openings that expose portions of the first electrode unit, and an insulation pattern that has a predetermined form on an upper surface of the second electrode unit, a fourth mask operation in which a source electrode and a drain electrode that contact the active layer through the contact holes are formed, the pixel electrode is formed from the first electrode unit, and the pad electrode including an electrode pattern formed below the insulation pattern is formed from the second electrode unit, and a fifth mask operation in which a pixel-defining layer that exposes at least a portion of the pixel electrode is exposed.

The electrode pattern and the insulation pattern may be formed to have the same pattern.

The second mask operation may include sequentially forming a first insulating layer, a first conductive layer, and a second conductive layer on the substrate to cover the active layer, and simultaneously patterning the first and second conductive layers into a gate bottom electrode and a gate top electrode to form the gate electrode and into a pad bottom electrode and a pad top electrode to form the second electrode unit.

The fourth mask operation may include forming a third conductive layer on the interlayer insulating layer, forming the source electrode and the drain electrode by patterning the third conductive layer, and removing portions of the second conductive layer constituting the first electrode unit to form the pixel electrode formed of the first conductive layer, and removing portions of the pad top electrode constituting the second electrode unit to form the pad electrode including openings that expose the pad bottom electrode and the electrode pattern formed of the second conductive layer.

The third mask operation may include forming the second insulating layer on the first and second electrode units, the gate electrode, and the pad electrode, and patterning the second insulating layer to form the contact holes, the openings that expose portions of the first electrode unit, and openings that expose the insulation pattern that has a predetermined form and portions of the second electrode unit.

The fifth mask operation may include forming a third insulating layer on an entire surface of the substrate to cover the source electrode and the drain electrode, and forming the pixel-defining layer by patterning the third insulating layer.

The first mask operation may further include forming a capacitor bottom electrode on the substrate of the same layer as the active layer. The second mask operation may further include forming a capacitor top electrode on the capacitor bottom electrode.

The method may further include forming an intermediate layer and an opposite electrode on the pixel electrode, after the fifth mask operation, the intermediate layer including an emissive layer.

BRIEF DESCRIPTION OF THE DRAWINGS

The above and other features and advantages will become more apparent by describing in detail exemplary embodiments thereof with reference to the attached drawings in which.

DETAILED DESCRIPTION

Figure 1:
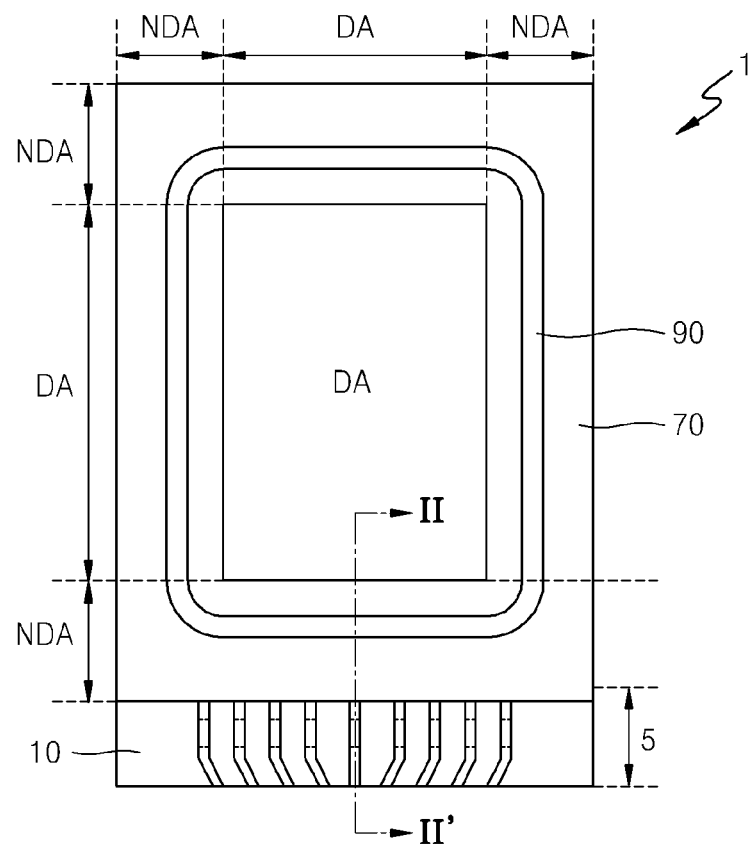
FIG. 1 is a schematic plane view illustrating an organic light-emitting display device according to an embodiment.

Embodiments will be illustrated in the drawings and described in detail in the written description. However, the description of embodiments is not intended to be limiting to particular modes of practice. It is to be appreciated that all changes, equivalents, and substitutes that do not depart from the spirit and technical scope thereof are encompassed herein. In the description, certain detailed explanations of related art are omitted when it is deemed that they may unnecessarily obscure the essence thereof.

While such terms as "first," "second," etc., may be used to describe various components, such components must not be limited to the above terms. The above terms are used only to distinguish one component from another.

The terms used in the present specification are merely used to describe embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The embodiments will now be described more fully with reference to the accompanying drawings, in which exemplary embodiments are shown.

FIG. 1 is a schematic plane view illustrating an organic light-emitting display (OLED) device 1 according to an embodiment.

Referring to FIG. 1, the organic light-emitting display device 1 may include a first substrate 10 comprising a plurality of light-emitting pixels and a second substrate 70 that may be adhered to the first substrate 10 by sealing.

A thin film transistor (TFT), an organic light-emitting device EL, and a capacitor Cst may be formed on the first substrate 10. Also, the first substrate 10 may be a low-temperature polycrystalline silicon (LTPS) substrate, a glass substrate or a plastic substrate.

The second substrate 70 may be an encapsulation substrate disposed on the first substrate 10 to protect the TFT, the light-emitting pixels, or the like formed on the first substrate 10, from external moisture or air. The second substrate 70 may be disposed to face the first substrate 10, and the first substrate 10 and the second substrate 70 may be bonded to each other using a sealing member 90 that is arranged along edges of the first and second substrate 10 and 70. The second substrate 70 may be a glass substrate, a plastic substrate or a stainless using steel (SUS) substrate.

The first substrate 10 may include a display area DA from which light is emitted and a non-display area NDA outside the display area DA. According to the embodiments, the sealing member 90 may be disposed on the non-display area NDA that is outside the display area DA to thus bond the first substrate 10 and the second substrate 70.

As described above, the organic light-emitting device EL, the TFT for driving the organic light-emitting device EL, and wirings that are electrically connected to these elements may be formed in the display area DA of the first substrate 10. The non-display area NDA may include a pad area 5 in which a pad electrode PAD that extends from the wirings of the display area DA is located.

Figure 2:
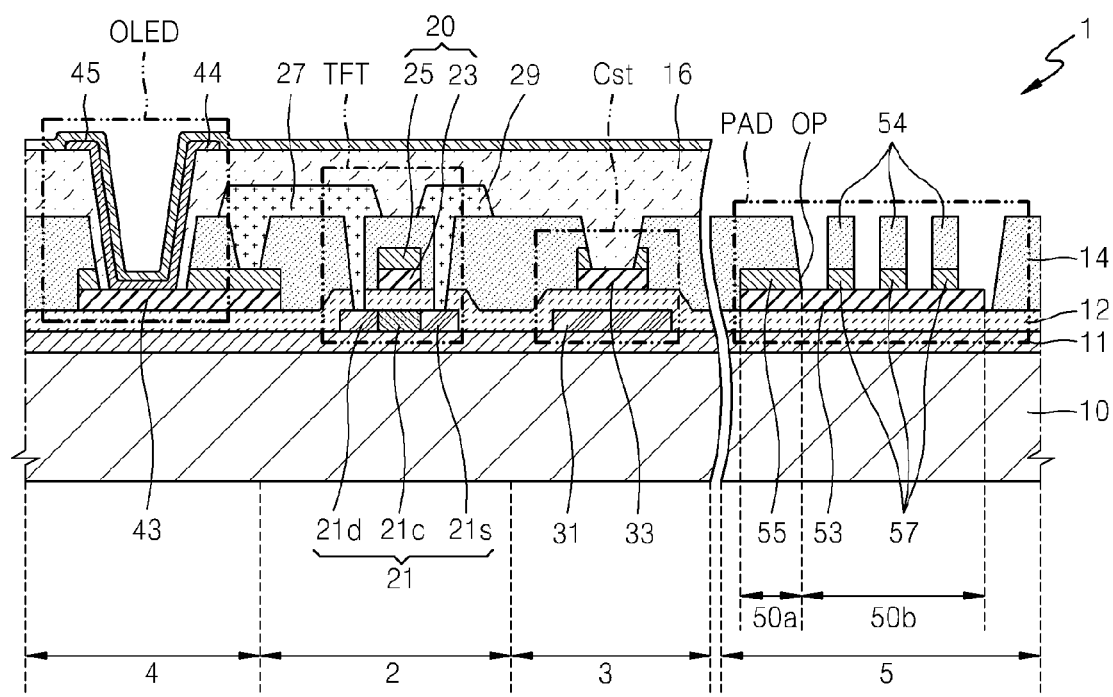
FIG. 2 is a cross-sectional view illustrating a portion of the organic light-emitting display device of FIG. 1 taken along a line II-II' according to an embodiment.

FIG. 2 is a cross-sectional view illustrating a portion of the organic light-emitting display device 1 of FIG. 1 taken along a line II-II' according to an embodiment.

Referring to FIG. 2, the organic light-emitting display device 1 may include a transistor area 2, a storage area 3, a light emission area 4, and the pad area 5.

A TFT may be included in the transistor area 2 as a driving element. The TFT may include an active layer 21, a gate electrode 20, and source and drain electrodes 29 and 27. The gate electrode 20 may be formed of a gate bottom electrode 23 and a gate top electrode 25 disposed on the gate bottom electrode 23; the gate bottom electrode 23 may be formed of a transparent conductive material. A first insulating layer 12 may be formed between the gate electrode 20 and the active layer 21 as a gate insulating layer that insulates the gate electrode 20 from the active layer 21. Also, source and drain areas 21s and 21d doped with high density impurities may be formed at sides of the active layer 21, and the source and drain areas 21s and 21d may be connected to the source and drain electrodes 29 and 27, respectively.

The capacitor Cst may be formed in the storage area 3. The capacitor Cst may include a capacitor bottom electrode 31 and a capacitor top electrode 33 with the first insulating layer 12 interposed therebetween. The capacitor bottom electrode 31 of the capacitor Cst may be formed on the same layer as the active layer 21 of the TFT. The capacitor bottom electrode 31 may be formed of a semiconductor material; the capacitor bottom electrode 31 may be doped with impurities, and thus, may have an increased electrical conductivity. The capacitor top electrode 33 of the capacitor Cst may be formed on the same layer as the gate bottom electrode 23 of the TFT and a pixel electrode 43 of the organic light-emitting device EL.

The organic light-emitting device OLED may be included in the light emission area 4. The organic light-emitting device OLED may include the pixel electrode 43 that is connected to one of the source and drain electrodes 29 and 27 of the TFT, an opposite electrode 45 disposed to face the pixel electrode 43, and an intermediate layer 44 interposed between the pixel electrode 43 and the opposite electrode 45. The pixel electrode 43 of the organic light-emitting device OLED may be formed of a transparent conductive material, and may be formed on the same layer as and of the same material as the gate bottom electrode 23 of the TFT.

The pad area 5 may include the pad electrode PAD. Although not shown in FIG. 2, the pad electrode PAD may be electrically connected to the TFT or the organic light-emitting device OLED via a wiring (not shown). Also, the pad electrode PAD may be electrically connected to a driver IC (not shown) that supplies a current to drive the organic light-emitting display device 1. Accordingly, the pad electrode PAD may receive the current from the driver IC and transmit the current to the TFT or the organic light-emitting device OLED in the display area DA (see FIG. 1) through the wirings (not shown). The pad electrode PAD may include a pad bottom electrode 53 formed on the same layer as and of the same material as the gate bottom electrode 23 of the gate electrode 20 and a pad top electrode 55 formed in on the same layer as and of the same material as the gate top electrode 35 of the gate electrode 20. The pad electrode PAD may include a first connection portion 50a connected to the display area DA (see FIG. 1) and a second connection portion 50b connected to the driver IC (not shown) via wirings (not shown). The second connection portion 50b may be exposed to the outside via an openings OP to be electrically connected to an external driver IC. The first connection portion 50a may be electrically connected to the TFT or the organic light-emitting device OLED via wirings (not shown), and may be covered with a second insulating layer 14 to be insulated from other structures.

The pad top electrode 55 corresponding to the second connection portion 50b of the pad electrode PAD may include the openings OP that expose the pad bottom electrode 53 disposed below the pad top electrode 55. Thus, an electrode pattern 57 and an insulation pattern 54 may be disposed on an upper surface of the pad bottom electrode 53 that is exposed to the outside via the openings OP. The electrode pattern 57 may be connected to the pad top electrode 55 and may be formed in on the same layer as and of the same material as the pad top electrode 55. The insulation layer 54 may be formed of the same layer as the second insulating layer 14, which is an interlayer insulating layer, and of the same material as the second insulating layer 14. The electrode pattern 57 and the insulation pattern 54 may have the same pattern. In other words, an upper surface of the electrode pattern 57 may be entirely covered by the insulation pattern 54 so that the upper surface of the electrode pattern 57 is not exposed to the outside. The pad bottom electrode 53 and side portions of the electrode pattern 57 that are exposed to the outside via the openings OP may be electrically connected to an external driver IC (not shown) via conductive balls 80 (see FIG. 12C), as described in detail below with reference to FIG. 12. It is to be understood that the term "exposed to the outside," as used herein, may refer to a condition before the second connection portion 50b, including, for example, the pad bottom electrode 53, electrode pattern 57, and insulating pattern 54, are connected to the external driver IC.

According to an embodiment, the electrode pattern 57 that has a predetermined form may be disposed on the pad bottom electrode 53 exposed to the outside in the second connection portion 50b of the pad electrode PAD. The upper surface of the electrode pattern 57 may be covered with the insulation pattern 54 so as not to be directly exposed to the outside. The pad bottom electrode 53 may include a material that has better corrosion resistance than the electrode pattern 57. In addition, the electrode pattern 57 may include a material that has a smaller resistance than that of the pad bottom electrode 53, through which a current flows easily. For example, the pad bottom electrode 53 may be formed of a transparent conductive metal oxide such as ITO, IZO, ZnO, or $In_2O_3$, and the electrode pattern 57 may be formed of at least one material selected from the group consisting of Ag, Mg, Al, Pt, Pd, Au, Ni, Nd, Ir, Cr, Li, Ca, Mo, Ti, W, MoW, and Cu.

Hereinafter, an effect of the embodiment will be described. For example, when the second connection portion 50b is formed of only the pad bottom electrode 53 such that only a driver IC (not shown) and the pad bottom electrode 53 are electrically connected, resistance dispersion may be caused in large-size panels of about 40 inches or greater, which degrades display quality. Experimentally, an average resistance of a pad formed of only the pad bottom electrode 53 is about 621Ω (ohms), and the standard deviation thereof is about 599Ω. When the second connection portion 50b is formed such that only the pad top electrode 55 is exposed and thus only a driver IC (not shown) and the pad top electrode 55 are electrically connected to each other, a pad in this case has an average resistance of about 144Ω, and the standard deviation thereof is about 2Ω. That is, when the second connection portion 50b is formed such that only the pad top electrode 55 is exposed, although resistance dispersion may be improved, a metal of the pad top electrode 55 may be directly exposed and thus corrodes easily, and this decrease in corrosion resistance may degrade the reliability of the organic light-emitting display device 1.

However, according to the structure of the organic light-emitting display device 1 illustrated in FIG. 2, the electrode pattern 57 may be disposed on the pad bottom electrode 53, thereby improving resistance dispersion and reducing contact resistance of the pad electrode PAD. Moreover, because the insulation pattern 54 may be formed on the upper surface of the electrode pattern 57, the upper surface of the electrode pattern 57 may not be directly exposed to the outside, thereby increasing corrosion resistance of the pad electrode PAD.

FIGS. 3 through 11 are cross-sectional views illustrating a method of manufacturing the organic light-emitting display device 1 of FIG. 2, according to an embodiment.

Figure 3:
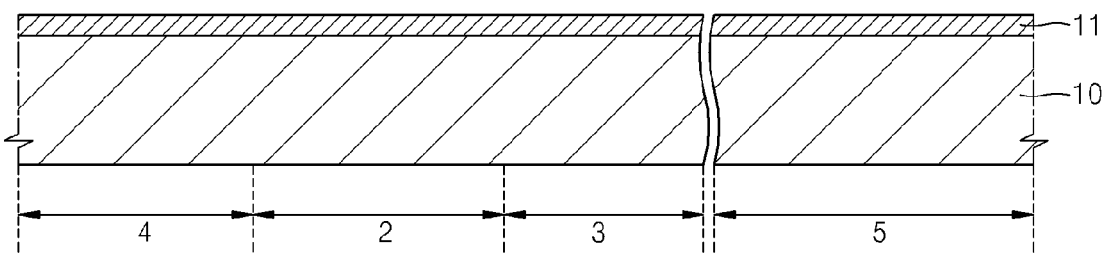
FIGS. 3 through 11 are cross-sectional views illustrating a method of manufacturing the organic light-emitting display device of FIG. 2, according to an embodiment.

First, as illustrated in FIG. 3, an auxiliary layer 11 may be formed on a first substrate 10. The first substrate 10 may be formed of a transparent glass material comprising $SiO_2$ as a main component. The first substrate 10 may also be formed of a transparent plastic material, a metal, or other substrate materials.

The auxiliary layer 11, such as a barrier layer, a blocking layer, and/or a buffer layer, prevents diffusion of impurity ions on an upper surface of the first substrate 10 and penetration of moisture or air into the first substrate 10, and planarizes a surface of the first substrate 10. The auxiliary layer 11 may be formed on an upper surface of the first substrate 10. The auxiliary layer 11 may be formed of $SiO_2$ and/or $SiN_x$ using various deposition methods such as a plasma-enhanced chemical vapor deposition (PECVD) method, an atmospheric pressure CVD (APCVD) method, a low pressure CVD method.

Figure 4:
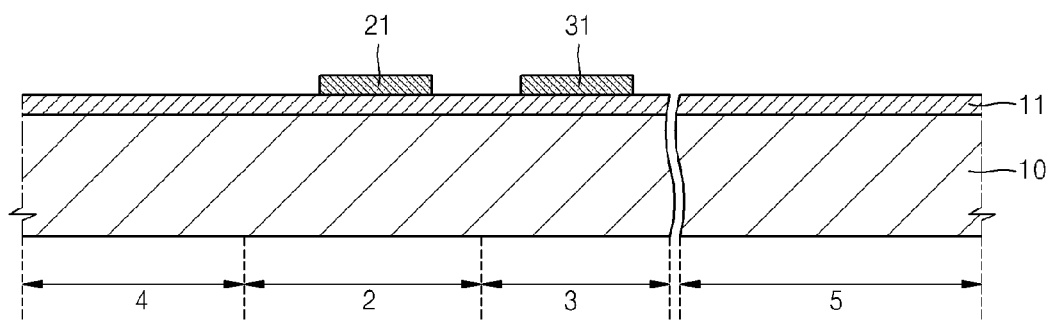

Next, as illustrated in FIG. 4, an active layer 21 and a capacitor bottom electrode 31 of a TFT may be formed on the auxiliary layer 11. In detail, first, an amorphous silicon layer (not shown) may be deposited on the auxiliary layer 11, and then, the amorphous silicon layer may be crystallized to form a polycrystalline silicon layer (not shown). The amorphous silicon layer may be crystallized using various methods such as a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method. Moreover, the polycrystalline silicon layer may be patterned into the active layer 21 of the TFT and the capacitor bottom electrode 31 of the capacitor Cst by using a mask operation using a first mask (not shown).

According to the current embodiment, the active layer 21 and the capacitor bottom electrode 31 may be separated but they may also be formed as a single unit.

Figure 5:
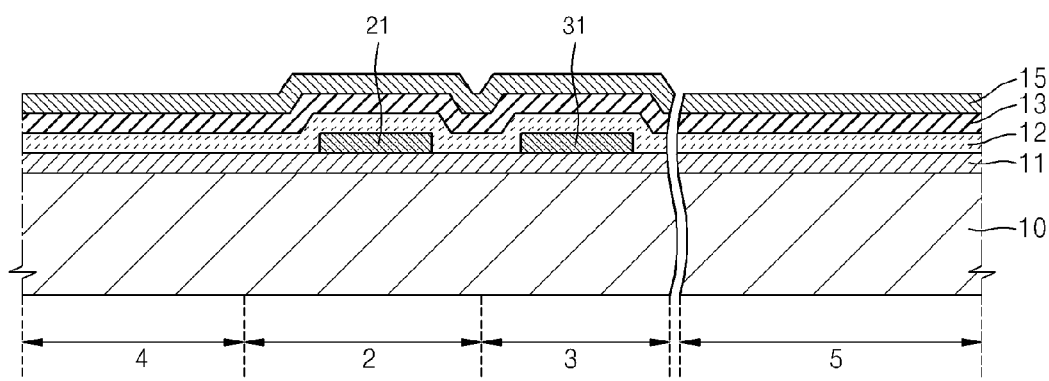

Next, as illustrated in FIG. 5, a first insulating layer 12, a first conductive layer 13, and a second conductive layer 15 may be sequentially formed on the first substrate 10 on which the active layer 21 and the capacitor bottom electrode 31 are formed.

The first insulating layer 12 may be deposited as an inorganic insulating layer such as $SiN_x$ or $SiO_x$ by using a PECVD method, an APCVD method, or an LPCVD method. The first insulating layer 12 may be interposed between the active layer 21 and a gate electrode 20 of the TFT to function as a gate insulating layer, and may also be interposed between a capacitor top electrode 33 and the capacitor bottom electrode 31 to function as a dielectric layer of the capacitor Cst.

The first conductive layer 13 may comprise at least one material selected from the group consisting of transparent materials such as ITO, IZO, ZnO, and $In_2O_3$. Later, the first conductive layer 13 may be patterned into a pixel electrode 43, a gate bottom electrode 23, the capacitor top electrode 33, and a pad bottom electrode 53.

The second conductive layer 15 may comprise at least one material selected from the group consisting of Ag, Mg, Al, Pt, Pd, Au, Ni, Nd, Ir, Cr, Li, Ca, Mo, Ti, W, MoW, and Cu. The second conductive layer 15 may preferably be formed in a three-layer structure of Mo—Al—Mo. Later, the second conductive layer 15 may be patterned into a gate top electrode 25, a pad top electrode 55, and an electrode pattern 57.

The first conductive layer 13 may include a material that has a better corrosion resistance than the second conductive layer 15, and the second conductive layer 15 may include a material that has a smaller resistance than the first conductive layer 13, through which a current flows easily.

Figure 6:
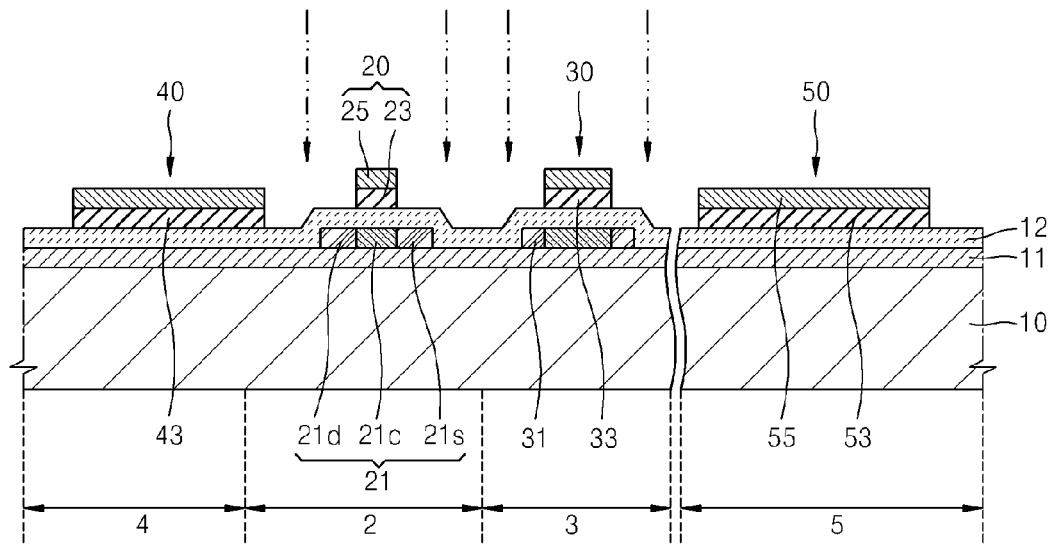

Next, as illustrated in FIG. 6, the gate electrode 20, a first electrode unit 40, a third electrode unit 30, and a second electrode unit 50 may be formed on the first substrate 10.

In detail, the first conductive layer 13 and the second conductive layer 15 that are sequentially stacked on the entire surface of the first substrate 10 may be patterned in a mask operation using a second mask (not shown).

The gate electrode 20 may be formed above the active layer 21 in the transistor area 2, and the gate electrode 20 may include the gate bottom electrode 23 that is formed from a portion of the first conductive layer 13 and a gate top electrode 25 that is formed from a portion of the second conductive layer 15.

Here, the gate electrode 20 may be formed to correspond to a center portion of the active layer 21; by using the gate electrode 20 as a self-aligned mask, the active layer 21 may be doped with n-type or p-type impurities to form source and drain areas 21s and 21d at sides of the active layer 21 and a channel area 21c interposed therebetween. The impurities may be boron (B) ions or phosphorus (P) ions.

In the storage area 3, the third electrode unit 30, which is to be formed later into the capacitor top electrode 33 which is on the capacitor bottom electrode 31, may be formed, and in the light emission area 4, the first electrode unit 40, which is to be formed later into the pixel electrode 43, may be formed. In the pad area 5, the second electrode unit 50, which is to be formed later into a pad electrode PAD, may be formed.

Figure 7:
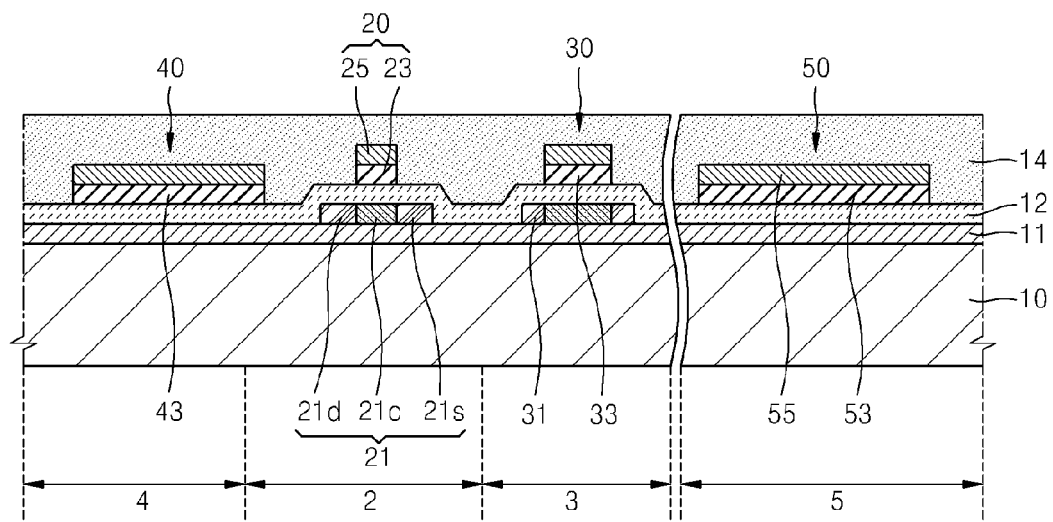

Next, as illustrated in FIG. 7, a second insulating layer 14 may be deposited on the entire surface of the first substrate 10 on which the gate electrode 20 is formed.

The second insulating layer 14 may be formed using at least one organic insulating material selected from the group consisting of polyimide, polyamide, acrylic resin, benzocyclobutene, and phenolic resin, and by using a method such as a spin coating method. The second insulating layer 14 may be formed to have a sufficient thickness, for example, to have a thickness that is greater than a thickness of the first insulating layer 12, so that the second insulating layer 14 functions as an interlayer insulating layer between the gate electrode 20 and the source and drain electrodes (29 and 27 of FIG. 2) of the TFT. The second insulating layer 14 may be formed of not only the above-described organic insulating material but also of an inorganic insulating material like the first insulating layer 12, or by alternately including an organic insulating material and an inorganic insulating material.

Figure 8:
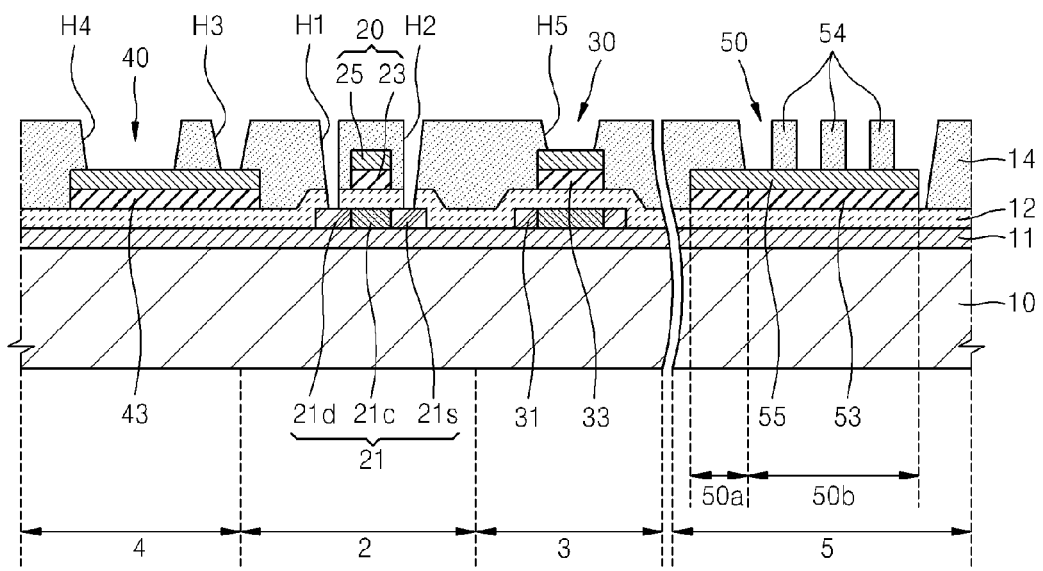

Next, as illustrated in FIG. 8, an interlayer insulating layer may be formed on the first substrate 10. That is, third, fourth, and fifth openings H3, H4, and H5 that expose the first and third electrode units 40 and 30, contact holes H1 and H2 that expose portions of the source and drain areas 21s and 21d of the active layer 21, and an insulation pattern 54 may be formed by patterning the second insulating layer 14.

In detail, the second insulating layer 14 may be patterned as the interlayer insulating layer using a mask operation using a third mask (not shown) to form the contact holes H1 and H2, the third, fourth, and fifth openings H3, H4, and H5, and the insulation pattern 54. The contact holes 141 and H2 respectively expose portions of the source and drain areas 21s and 21d, and the third opening H3 and the fourth opening H4 expose at least a portion of the second conductive layer 15, which corresponds to an upper portion of the first electrode unit 40. The fifth opening H5 exposes at least a portion of the second conductive layer 15, which corresponds to an upper portion of the third electrode unit 30. Also, the insulation pattern 54 that has a predetermined form may be formed in the second connection portion 50b of the second electrode unit 50; the insulation pattern 54 exposes at least a portion of the second conductive layer 15, which corresponds to an upper portion of the second electrode unit 50. The insulation pattern 54 has a predetermined form unlike the contact holes H1 and H2 or the third through fifth openings H3 through H5.

As illustrated in FIG. 8, the third and fifth openings H3 and H5 may be formed to expose the entire of the third electrode unit 30 and the first electrode unit 40. Other configurations are possible.

Figure 9:
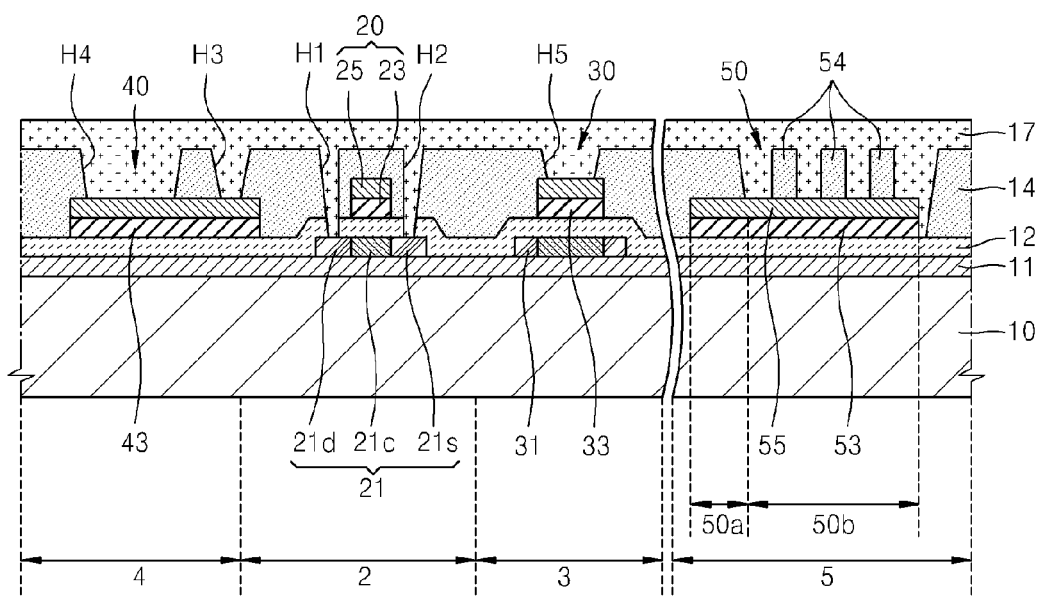

Next, as illustrated in FIG. 9, a third conductive layer 17 may be deposited on the entire surface of the first substrate 10 to cover the second insulating layer 14.

The third conductive layer 17 may be formed of the same material of the first conductive layer 13 or the second conductive layer 15 described above. The third conductive layer 17 may also be formed of other conductive materials. Also, the conductive material of the third conductive layer 17 may be deposited to have a sufficient thickness so that the contact holes H1 and H2, the third, fourth, and fifth openings H3, H4, and H5, and the spaces between the insulation patterns 54 may be filled.

Figure 10:
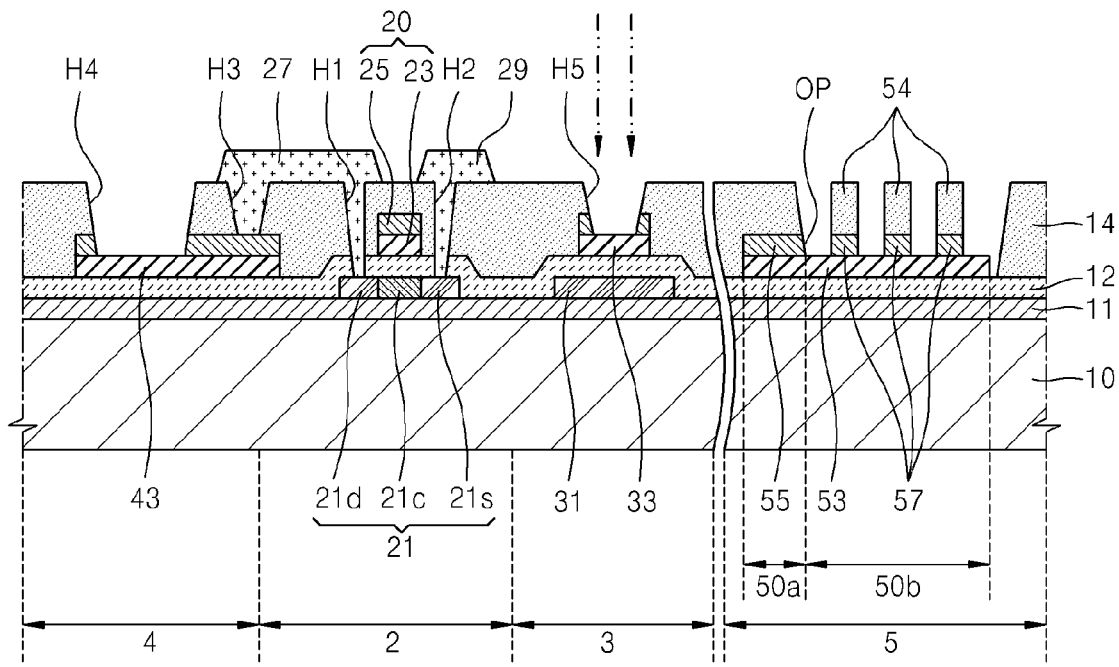

Next, as illustrated in FIG. 10, the third conductive layer 17 (see FIG. 10) may be patterned to form the source and drain electrodes 29 and 27, the pixel electrode 43, the capacitor top electrode 33, and the pad electrode PAD including the electrode pattern 57.

In detail, the third conductive layer 17 may be patterned in a mask operation using a fourth mask (not shown) to form the source and drain electrodes 29 and 27.

One of the source and drain electrodes 29 and 27, here, the source and drain electrode 27, may be formed in the third opening H3 to contact the pixel electrode 43 through an edge portion of the second conductive layer 15, which is the upper portion of the first electrode unit 40 (see FIG. 8).

At the same time when forming the source and drain electrodes 29 and 27, the pixel electrode 43 and the capacitor top electrode 33 may also be formed. The pixel electrode 43 and the capacitor top electrode 33 may be formed by etching after forming the source and drain electrodes 29 and 27. In detail, a portion of the second conductive layer 15 exposed through the fourth opening H4 may be removed from the first electrode unit 40 (see FIG. 8) to form the pixel electrode 43. Also, a portion of the second conductive layer 15 exposed through the fifth opening H5 may be removed from the third electrode unit 30 (see FIG. 8) to form the capacitor top electrode 33. Openings OP may be formed by removing portions of the pad top electrode 55 in the second electrode unit 50 (see FIG. 8), except portions corresponding the insulation pattern 54, to thereby form the electrode pattern 57. Accordingly, the electrode pattern 57 has the same pattern as the insulation pattern 54. The electrode pattern 57 may be formed in the second connection portion 50b that is electrically connected to a driver IC (not shown) as described above.

Thus, the gate bottom electrode 23, the capacitor top electrode 33, and the pixel electrode 43 may be formed on the same layer and of the same material.

Here, the capacitor bottom electrode 31 may be doped by injecting n-type or p-type impurities through the fifth opening H5. The impurities to be injected when doping the capacitor bottom electrode 31 may be the same as or different from those used in doping the active layer 21.

Figure 11:
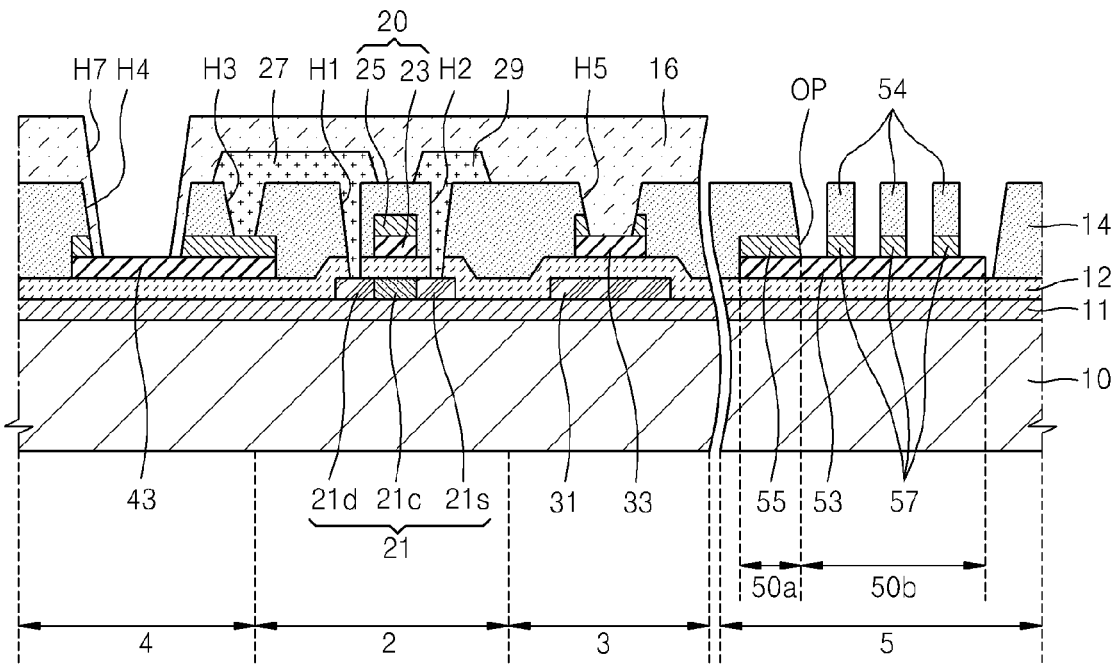

Next, as illustrated in FIG. 11, a pixel-defining layer (PDL) may be formed on the first substrate 10.

In detail, a third insulating layer 16 may be deposited on the entire surface of the first substrate 10 on which the pixel electrode 43, the source and drain electrodes 29 and 27, the capacitor top electrode 33, and the pad electrode PAD are formed. The third insulating layer 16 may be formed using at least one organic insulating material selected from the group consisting of polyimide, polyamide, acrylic resin, benzocyclobutene, and phenolic resin, and by using a method such as a spin coating method. The third insulating layer 16 may be formed of not only the above-described organic insulation materials but also of inorganic insulating materials selected from the group consisting of $SiO_2$, SiNx, $Al_2O_3$, $CuO_x$, $Tb_4O_7$, $Y_2O_3$, $Nb_2O_5$, and $Pr_2O_3$. Also, the third insulating layer 16 may be formed in a multi-layer structure in which an organic insulating material and an inorganic insulating material are alternately formed.

Selectively, the third insulating layer 16 may be deposited on the pad area 5 or may not be deposited.

The third insulating layer 16 may be patterned as the PDL by using a mask operation in which a fifth mask (not shown) is used to form a seventh opening H7 that exposes a center portion of the pixel electrode 43 and thus to define pixels.

Then, as illustrated in FIG. 2, an intermediate layer 44 comprising an organic emissive layer and an opposite electrode 45 may be formed in the seventh opening H7 that exposes the pixel electrode 43.

The intermediate layer 44 may be formed in a stack structure in which at least one of a plurality of functional layers such as an organic emissive layer (EML), a hole transport layer (HTL), a hole injection layer (HIL), an electron transport layer (ETL), and an electron injection layer (EIL) is stacked in a single-layer structure or a multi-layer structure.

The organic EML may include low-molecular weight organic materials or polymer organic materials.

When the organic EML is formed of a low-molecular organic material, the intermediate layer 44 may include a HTL and a HIL around the organic emissive layer in a direction towards the pixel electrode 43, and an ETL and an EIL in a direction towards the opposite electrode 45. Also, other layers may be stacked as desired. Examples of organic materials include copper phthalocyanine (CuPc), N,N'-Di(naphthalene-1-yl)-N,N'-diphenyl-benzidine (NPB), and tris-8-hydroxyquinoline aluminum (Alq3).

When the organic EML is formed of a polymer organic material, the intermediate layer 44 may include only a HTL from the organic emissive layer in a direction toward the pixel electrode 43. The HTL may be formed on the pixel electrode 43 using poly-(2,4)-ethylene-dihydroxy thiophene (PEDOT) or polyaniline (PANI) by using an inkjet printing method or a spin coating method. Examples of organic materials that may be used here include polymer organic materials such as polyphenylene vinylene (PPV) and polyfluorene; the organic EML may be formed by using methods such as an inkjet printing method, a spin coating method, of a laser induced thermal imaging (LITI) method.

The opposite electrode 45 may be deposited on the entire surface of the first substrate 10 as a common electrode. In the organic light-emitting display device 1 according to the current embodiment, the pixel electrode 43 may be used as an anode and the opposite electrode 45 may be used as a cathode. However, the polarities of the electrodes may also be switched.

When the organic light-emitting display device 1 is a bottom emission type display device in which an image is formed in a direction towards the first substrate 10, the pixel electrode 43 may be a transparent electrode and the opposite electrode 45 may be a reflective electrode. The reflective electrode may be formed by depositing a thin layer using a metal having a small work function, such as Ag, Mg, Al, Pt, Pd, Au, Ni, Nd, Ir, Cr, Li, Ca, LiF/Ca, LiF/Al, or a combination of these.

Figure 12A:
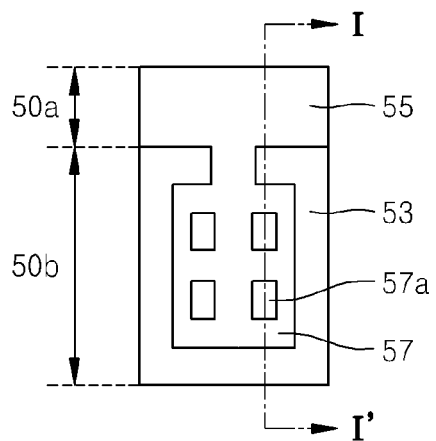
FIGS. 12A, 12B, and 12C are detailed views illustrating a pad electrode included in the organic light-emitting display device of FIG. 2, according to an embodiment.
Figure 12B:
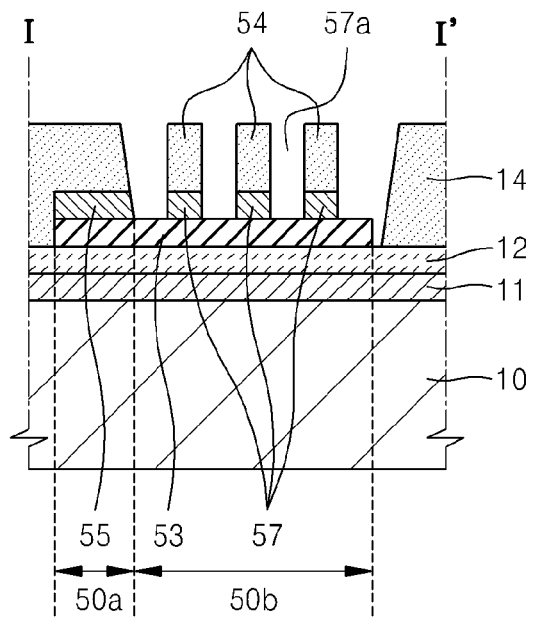
Figure 12C:
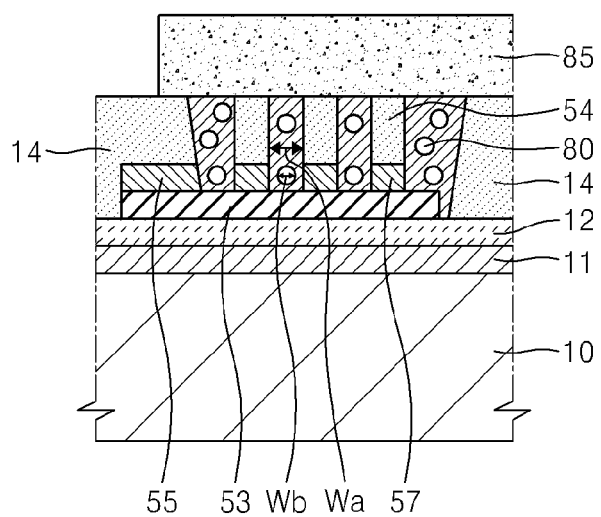

FIGS. 12A, 12B, and 12C are detailed views illustrating the pad electrode PAD included in the organic light-emitting display device 1 of FIG. 2, according to an embodiment. FIGS. 13, 14A, 14B, and 14C, 15, and 16 are detailed views illustrating the pad electrode PAD included in the organic light-emitting display device 1 of FIG. 2, according to embodiments.

Referring to FIGS. 12A, 12B, and 12C, 13, 14A, 14B, and 14C, 15, and 16, the electrode pattern 57 may be formed in the second connection portion 50b that is defined by the openings OP, and the electrode pattern 57 may be connected to the pad top electrode 55 to protrude from the pad top electrode 55 to at least a center portion of the pad bottom electrode 53 corresponding to the second connection portion 50b., in order to enable a stable connection to a driver IC (not shown). The insulation pattern 54 may be formed to cover the upper surface of the electrode pattern 57 in all embodiments, and accordingly, the upper surface of the electrode pattern 57 may not be directly exposed to the outside, thereby increasing corrosion resistance of the pad electrode PAD.

FIG. 12A is a schematic plane view illustrating the pad electrode PAD of FIG. 2, according to an embodiment, and FIG. 12B is a cross-sectional view illustrating the pad electrode PAD of FIG. 12A taken along a line I-I', and FIG. 12C is a cross-sectional view illustrating the pad electrode PAD of FIG. 12B to which a driver IC 85 is connected.

Referring to FIGS. 12A, 12B, and 12C, the electrode pattern 57 may include through-holes 57a that expose the pad bottom electrode 53. A maximum width Wa of the through-hole 57a may be greater than a maximum width Wb of the conductive ball 80 that electrically connects the pad electrode PAD to the driver IC 85, in order to enable the conductive ball 80 to be inserted into the through-hole 57a and thus easily electrically connect the pad electrode PAD to the driver IC 85 via the conductive ball 80.

Figure 13:
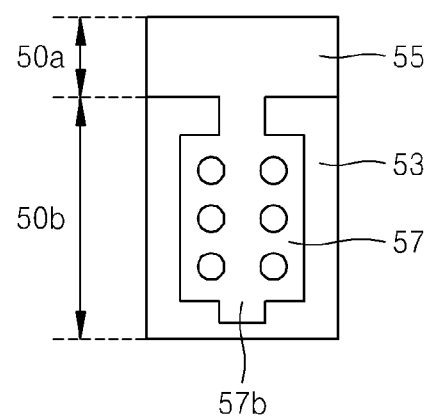
FIGS. 13, 14A, 14B, 14C, 15, and 16 are detailed views illustrating a pad electrode included in the organic light-emitting display device of FIG. 2, according to other embodiments.

FIG. 13 is a schematic plane view illustrating a pad electrode PAD according to another embodiment. The number of through-holes 57a, and the arrangement and shape thereof may vary. In addition, the electrode pattern 57 may include various protrusions 57b. Also, the shape, position, and size thereof may vary.

Figure 14A:
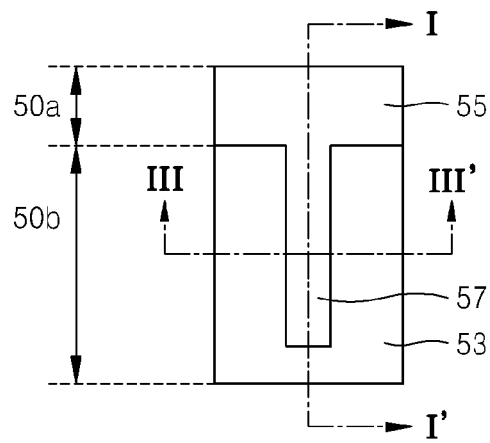
Figure 14B:
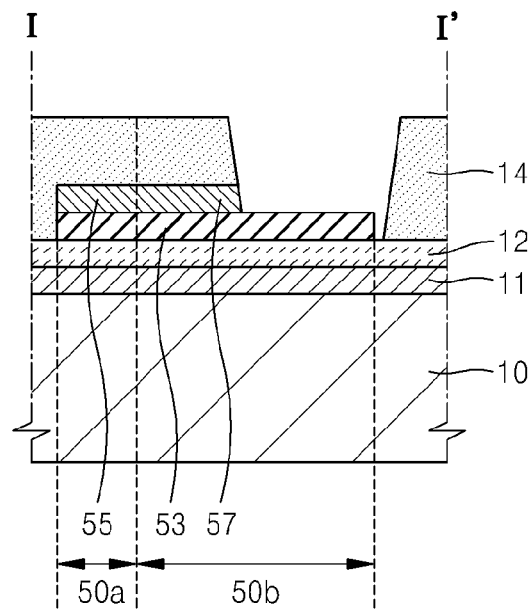

FIG. 14A is a schematic plane view illustrating a pad electrode PAD according to another embodiment. FIG. 14B is a cross-sectional view of the pad electrode PAD of FIG. 14A taken along a line I-I', and FIG. 14C is a cross-sectional view illustrating the pad electrode PAD of FIG. 14A taken along a line III-III'.

Figure 14C:
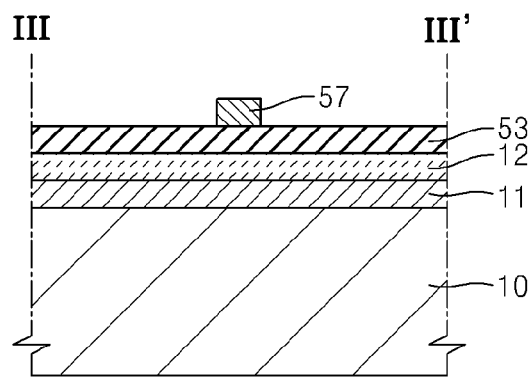

Referring to FIGS. 14A, 14B, and 14C, an electrode pattern 57 may include at least one bar shape that is connected to a pad top electrode 55. The electrode pattern 57 formed in a bar shape may be more resistant to severe corrosion than the electrode pattern 57 in which the through-hole 57a is formed (see FIG. 12).

Figure 15:
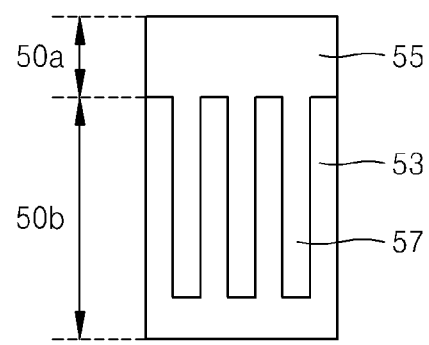
Figure 16:
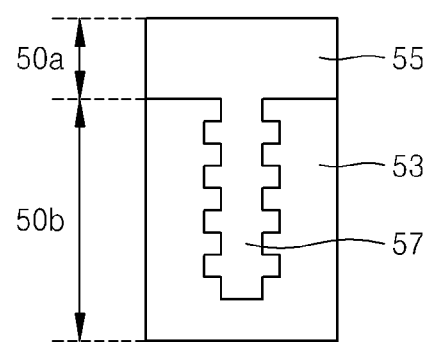

FIGS. 15 and 16 are schematic plane views illustrating a pad electrode PAD according to other embodiments. However, the shape of the electrode patterns 57 may have other shapes.

As described herein, in order to form minute patterns including TFTs on a substrate, on which a flat panel display device is to be formed, the patterns are transferred to an array substrate by using a mask in which the minute patterns are formed. In each mask operation of the method of manufacturing the above-described organic light-emitting display device 1, the stacked layers may be removed using a dry etching method or a wet etching method.

In an operation of transferring patterns using a mask, first, a mask including desired patterns has to be prepared, and thus the manufacturing costs for preparing the mask may increase as the number of processes using a mask increases. Also, because complicated operations as described above may need to be conducted, a manufacturing process may be complicated, and the time for manufacturing may be increased, thereby increasing manufacturing costs.

According to the bottom emission type display device of the embodiments, a metal layer may be formed in a lowermost portion of a substrate, separately from a pixel electrode, without increasing the number of masks. Accordingly, light emission efficiency of the pixel electrode may be increased and etching characteristics of a gate electrode may be provided, thereby increasing display quality of a display device and simplifying the manufacturing process and reducing defects of the display device.

While an organic light-emitting display device has been described as an example, the embodiments may also apply to other display devices such as a liquid crystal display device.

In addition, while only one TFT and one capacitor are illustrated in the drawings, for convenience of description, a plurality of TFTs and a plurality of capacitors may be included without increasing the number of mask operations.

According to the embodiments, the manufacturing process of the organic light-emitting display device may be simplified, and corrosion resistance of a pad portion may be improved and contact resistance of a pad portion may be reduced, thereby enhancing the reliability of the organic light-emitting display device.

While the embodiments have been particularly shown and described with reference to exemplary embodiments thereof, it will be understood by those of ordinary skill in the art that various changes in form and details may be made therein without departing from the spirit and scope thereof as defined by the following claims.

What is claimed is:

1. An organic light-emitting display device, comprising:
a thin film transistor including an active layer, a gate electrode including a gate bottom electrode and a gate top electrode, an insulating layer on the thin film transistor, and a source electrode and a drain electrode formed on the insulating layer to contact the active layer;
an organic light-emitting device that is electrically connected to the thin film transistor and includes a pixel electrode formed of a same layer as the gate bottom electrode, an intermediate layer including an emissive layer, and an opposite electrode, the pixel electrode, intermediate layer and opposite electrode being sequentially stacked; and
a pad electrode including a pad bottom electrode formed of the same layer as the gate bottom electrode and a pad top electrode formed of a same layer as the gate top electrode,
wherein the pad top electrode includes openings that expose the pad bottom electrode, and
an electrode pattern formed of a same layer as the pad top electrode and an insulation pattern that covers an upper surface of the electrode pattern and is formed of a same layer as the insulating layer, wherein the electrode pattern and the insulation pattern are formed on an upper surface of the pad bottom electrode that is exposed to the outside through the openings.

2. The organic light-emitting display device as claimed in claim 1, wherein the pad bottom electrode and side portions of the electrode pattern that are exposed to the outside through the openings are configured to be electrically connected to a driver IC that supplies a current to drive the organic light-emitting display device.

3. The organic light-emitting display device as claimed in claim 2, wherein the pad bottom electrode and the side portions of the electrode pattern that are exposed to the outside through the openings are configured to be electrically connected to the driver IC via conductive balls.

4. The organic light-emitting display device as claimed in claim 1, wherein the electrode pattern is connected to the pad top electrode.

5. The organic light-emitting display device as claimed in claim 1, wherein the electrode pattern protrudes from the pad top electrode to at least a center portion of the pad bottom electrode that is exposed to the outside through the openings.

6. The organic light-emitting display device as claimed in claim 1, wherein the electrode pattern includes a through-hole that exposes the pad bottom electrode below.

7. The organic light-emitting display device as claimed in claim 6, wherein the pad bottom electrode and the side portions of the electrode pattern are configured to be electrically connected to the driver IC via conductive balls disposed in the through-hole, and a maximum width of the through-hole is greater than a maximum width of the conductive balls.

8. The organic light-emitting display device as claimed in claim 1, wherein the electrode pattern includes at least one bar that is connected to the pad top electrode.

9. The organic light-emitting display device as claimed in claim 1, wherein the electrode pattern and the insulation pattern have a same pattern.

10. The organic light-emitting display device as claimed in claim 1, wherein the pad electrode is electrically connected to the thin film transistor or the organic light-emitting display device via wirings.

11. The organic light-emitting display device as claimed in claim 1, wherein the pad bottom electrode includes a material that has a better corrosion resistance than the pad top electrode and the electrode pattern.

12. The organic light-emitting display device as claimed in claim 1, wherein:
  the gate bottom electrode, the pixel electrode, and the pad bottom electrode include a transparent conductive metal oxide, and
  the gate top electrode, the pad top electrode, and the electrode pattern include at least one of Ag, Mg, Al, Pt, Pd, Au, Ni, Nd, Ir, Cr, Li, Ca, Mo, Ti, W, MoW, and Cu.

13. The organic light-emitting display device as claimed in claim 1, further comprising a capacitor that includes a capacitor bottom electrode formed of a same layer as the active layer and a capacitor top electrode formed of same layers as the gate electrode and that is electrically connected to the thin film transistor.

14. A method of manufacturing an organic light-emitting display device, the method comprising:
  a first mask operation in which an active layer of a thin film transistor is formed on a substrate;
  a second mask operation in which a first electrode unit for forming a pixel electrode, a gate electrode, and a second electrode unit for forming a pad electrode are formed on the substrate;
  wherein the second mask operation includes: sequentially forming a first insulating layer, a first conductive layer, and a second conductive layer on the substrate to cover the active layer; and simultaneously patterning the first and second conductive layers into a gate bottom electrode and a gate top electrode to form the gate electrode and into a pad bottom electrode and a pad top electrode to form the second electrode unit,
  a third mask operation in which an interlayer insulating layer is formed, the interlayer insulating layer having contact holes that expose two side upper portions of the active layer, openings that expose portions of the first electrode unit, and an insulation pattern that has a predetermined form on an upper surface of the second electrode unit;
  a fourth mask operation in which a source electrode and a drain electrode that contact the active layer through the contact holes are formed, the pixel electrode is formed from the first conductive layer of the first electrode unit, and the pad electrode including an electrode pattern formed below the insulation pattern is formed from the second electrode unit; and
  a fifth mask operation in which a pixel-defining layer that exposes at least a portion of the pixel electrode is exposed;
  further comprising forming an intermediate layer and an opposite electrode on the pixel electrode, after the fifth mask operation, the intermediate layer including an emissive layer;
  and wherein the fourth mark operation includes removing portions of the pad top electrode constituting the second electrode unit to form the pad electrode including openings that expose the pad bottom electrode and the electrode pattern formed of the second conductive layer.

15. The method as claimed in claim 14, wherein the electrode pattern and the insulation pattern are formed to have the same pattern.

16. The method as claimed in claim 14, wherein the fourth mask operation includes:
  forming a third conductive layer on the interlayer insulating layer;
  forming the source electrode and the drain electrode by patterning the third conductive layer; and
  removing portions of the second conductive layer constituting the first electrode unit to form the pixel electrode formed of the first conductive layer.

17. The method as claimed in claim 14, wherein the third mask operation includes: forming the second insulating layer on the first and second electrode units, the gate electrode, and the pad electrode; and patterning the second insulating layer to form the contact holes, the openings that expose portions of the first electrode unit, and openings that expose the insulation pattern that has a predetermined form and portions of the second electrode unit.

18. The method as claimed in claim 14, wherein the fifth mask operation includes: forming a third insulating layer on an entire surface of the substrate to cover the source electrode and the drain electrode; and forming the pixel-defining layer by patterning the third insulating layer.

19. The method as claimed in claim 14, wherein: the first mask operation further includes forming a capacitor bottom electrode on the substrate of the same layer as the active layer, and the second mask operation further includes forming a capacitor top electrode on the capacitor bottom electrode.

* * * * *